United States Patent [19]

Ikeda et al.

[11] Patent Number: 5,361,230
[45] Date of Patent: Nov. 1, 1994

[54] MEMORY DEVICE DELAYING TIMING OF OUTPUTTING DATA IN A TEST MODE AS COMPARED WITH A NORMAL OPERATING MODE

[75] Inventors: Yuto Ikeda; Yoshinori Inoue, both of Hyogo, Japan

[73] Assignee: Mitsubishi Denki Kabushiki Kaisha, Tokyo, Japan

[21] Appl. No.: 68,709

[22] Filed: May 28, 1993

[30] Foreign Application Priority Data

Jun. 5, 1992 [JP] Japan .................. 4-145749

[51] Int. Cl.$^5$ .............................. G11C 17/00
[52] U.S. Cl. .................. 365/194; 365/201; 365/233; 365/233.5
[58] Field of Search .......... 365/201, 233, 194, 233.5

[56] References Cited

U.S. PATENT DOCUMENTS 4,630,239 12/1986 Reed et al. .................. 365/203

Primary Examiner—Eugene R. LaRoche
Assistant Examiner—F. Niranjan
Attorney, Agent, or Firm—Lowe, Price, LeBlanc & Becker

[57] ABSTRACT

The present invention relates to a memory device having reduced access time of memory cells in a test mode. The memory device forms, in the test mode, read data $D_R$ by applying Ex-OR processing to a plurality of data read from a memory cell array 11 by a data processing circuit 5, to provide the formed data to the outside through a data output circuit 6. The timing of the output of data to the outside is delayed, by delay circuit 12 in the test mode, than that in the normal operation by a time period corresponding to time required for the EX-OR processing in data processing circuit 5. Consequently, output of invalid data to the outside can be prevented, and thus access time of valid data can be reduced.

8 Claims, 8 Drawing Sheets

FIG.2
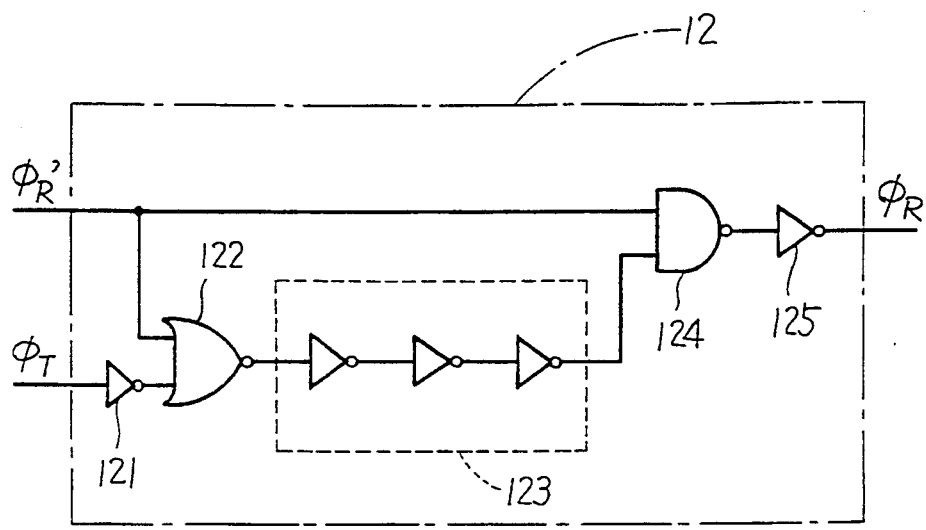
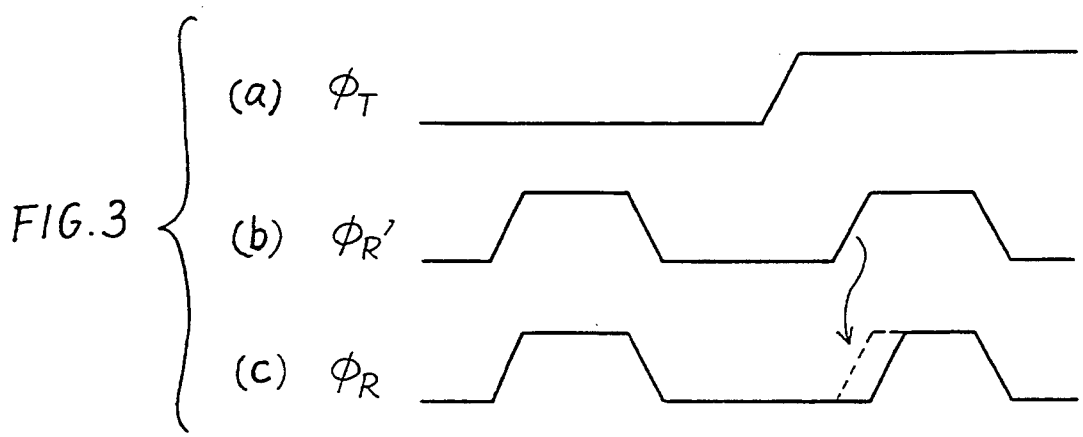
FIG.3 (a) $\phi_T$
(b) $\phi_R'$
(c) $\phi_R$

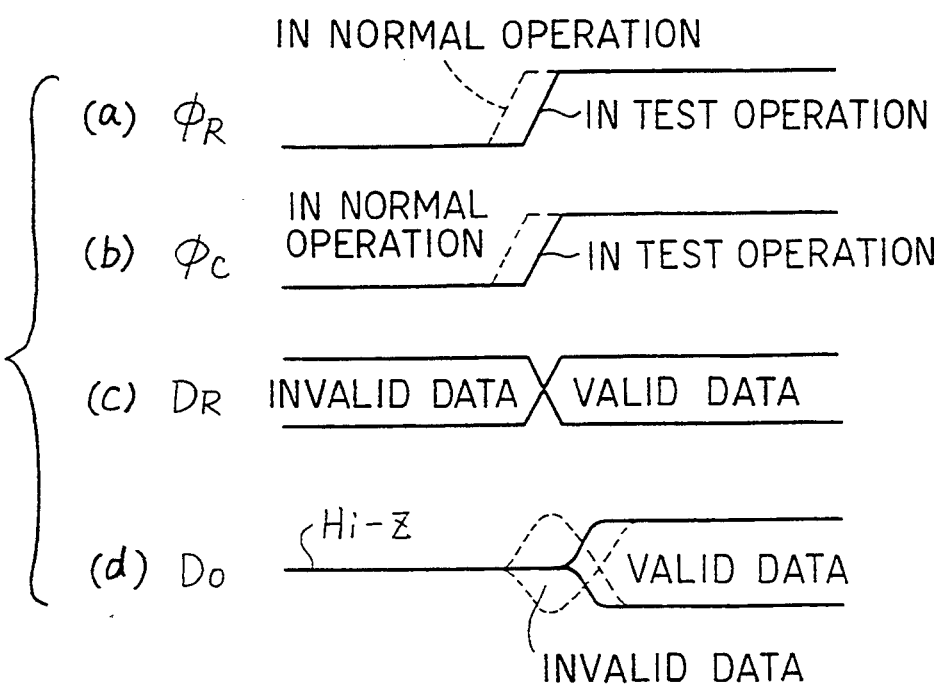

MEMORY DEVICE DELAYING TIMING OF OUTPUTTING DATA IN A TEST MODE AS COMPARED WITH A NORMAL OPERATING MODE

BACKGROUND OF THE INVENTION

1. Field of the Invention

The present invention relates to memory devices, and particularly to a memory device having reduced test time of memory cells in a test mode.

2. Description of the Background Art

A memory device, such as a dynamic random access memory (DRAM), is generally provided with a circuit for testing a function of each of memory cells constituting a memory cell array.

FIG. 6 is a block diagram showing one example of a conventional memory device. In FIG. 6, a memory cell array 11 comprises a multiplicity of memory cells (not shown) two-dimensionally arranged in row and column directions. Data reading circuits 1 to 4 constituting data reading means respond to a read control signal $\phi_R$, to be described later, which is supplied from a waveform shaping circuit 9 to read simultaneously data from respective selected memory cells among the memory cells constituting memory cell array 11, amplify the read data, and then apply the amplified data to a data processing circuit 5 as data $D_1$ to $D_4$.

When a mode designating signal $\phi_T$ supplied from a signal source, not shown, designates a normal operation mode, data processing circuit 5 serves as a data selecting circuit, selecting any one of the data $D_1$ to $D_4$ in response to an address signal $\phi_A$ of four bits supplied from an address signal source, not shown, to provide the selected data as read data $D_R$. When the mode designating signal $\phi_T$ designates a test mode, data processing circuit 5 serves as an exclusive OR (EX-OR) circuit, providing the signal $D_R$ which indicates whether all of the four data $D_1$ to $D_4$ are the same, or at least any one of them is different from the others. Data processing circuit 5 will be described later in detail.

The data $D_R$ provided from data processing circuit 5 is applied to a data output circuit 6. Data output circuit 6 provides the aforementioned data $D_R$ as output data $D_O$ at the timing defined by an output control signal $\phi_C$ supplied from an output control circuit 7 to supply the data D0 to the outside through an external output terminal 8. Data output circuit 6 and output control circuit 7 will be described later in detail.

A row address strobe ($\overline{RAS}$) signal supplied from a signal source, not shown, is applied to a timing generating circuit 10, which generates a predetermined timing signal $\phi_R'$ synchronized with the $\overline{RAS}$ signal to apply the same to waveform shaping circuit 9.

Waveform shaping circuit 9 comprising two stages of inverters (not shown) applies waveform shaping to the above mentioned timing signal $\phi_R'$ to generate the read control signal $\phi_R$ and apply the same to output control circuit 7, as well as to data reading circuits 1 to 4 as described above. Output control circuit 7 generates the above mentioned output control signal $\phi_C$ based on the read control signal $\phi_R$.

FIGS. 7, 8 and 9 are schematic diagrams showing examples of the structures of data processing circuit 5, data output circuit 6 and output control circuit 7, respectively, and FIGS. 10 and 11 are waveform diagrams showing the operation of the conventional memory device shown in FIG. 6. Referring to FIGS. 6 to 11, the operation of the conventional memory device will be hereinafter described in detail.

In the normal operation mode, the mode designating signal $\phi_T$ is assumed to be at a low (L) level. Therefore, in FIG. 7, a switching transistor 57 of a switching circuit 82 in data processing circuit 5 is turned off in response to the signal $\phi_T$, while a switching transistor 58 of switching circuit 82 is turned on in response to an inverted signal of the signal $\phi_T$ by an inverter 59.

Also, in the normal operation mode, four bits ($\phi_{A1}$, $\phi_{A2}$, $\phi_{A3}$, $\phi_{A4}$) of the address signal $\phi_A$ are applied to the control inputs of switching transistors 51 to 54 of a selecting circuit 81, respectively, so that only one of them is turned on. Accordingly, only one data, among the four input data $D_1$ to $D_4$, corresponding to the switching transistor which is turned on is provided as read data $D_R$ through the corresponding transistor and transistor 58 of switching circuit 82.

In the test mode, on the other hand, the mode designating signal $\phi_T$ is assumed to be at a high (H) level. Therefore, in FIG. 7, switching transistor 57 of switching circuit 82 in data processing circuit 5 is turned on in response to the signal $\phi_T$, while switching transistor 58 of switching circuit 82 is turned off in response to an inverted signal of the signal $\phi_T$ by inverter 59.

In the test mode, the address signal $\phi_A$ for selecting read data is invalid, and the above described data selection is not carried out. Instead, the four data $D_1$ to $D_4$ are exclusive-ORed by an EX-OR gate 55 in a logic operation circuit 83, and the result is provided as the read data $D_R$ through an inverter 56 and transistor 57. As a result, when all of the four data $D_1$ to $D_4$ read from the memory cell array coincide with each other, the read data $D_R$ at an H level is provided, and in the other cases the read data $D_R$ at an L level is provided.

The output control signal $\phi_C$ supplied from output control circuit 7 comprising two stage of inverters 71 and 72, as shown in FIG. 9, is a control signal which is inactive at an L level, and is assumed to be in the inactive state during a period corresponding to read data of a so-called invalid address (invalid data) in memory cell array 11, based on the read control signal $\phi_R$ synchronized with the $\overline{RAS}$ signal.

Referring to FIG. 10 in which the operation in the normal operation mode is shown, the read data $D_R$ (FIG. 10(b)) is invalid data corresponding to an invalid address during the period the output control signal $\phi_C$ (FIG. 10 (a)) is at an L level, so that the output $D_O$ (FIG. 10 (c)) of data output circuit 6 comprising an NAND gate 61 and an inverter 62, as shown in FIG. 8, is rendered in a high impedance state (Hi-Z).

With the address of read data changing from invalid to valid, the read data $D_R$ changes from invalid data to valid data (FIG. 10 (b)). The control signal $\phi_C$ (FIG. 10 (a)) rises to an H level at a timing defined in advance with respect to the timing of this change to be in the active state. As a result, data output circuit 6 of FIG. 8 provides the data $D_R$ supplied from data processing circuit 5 to the outside as the output data $D_O$ (FIG. 10 (c)).

Referring to FIG. 11 in which the operation in the test mode is shown, the basic operation is the same as that shown in FIG. 10, except that the read data $D_R$ (FIG. 11(b)) is not the one selected from the four data $D_1$ to $D_4$, but the one obtained by EX-OR processing of the data $D_1$ to $D_4$. However, it should be noticed that time required for the EX-OR operation causes delay by a certain time period in the timing of change of the read data $D_R$ from invalid to valid in the test mode, with respect to the timing of such change of the read data $D_R$ in the nominal operation mode.

Also in the test mode, the output control signal $\phi_C$ has the same waveform as in the normal operation mode, as shown by the solid line (FIG. 11 (a)), which results in partial output of the invalid data $D_R$ as the output data $D_O$ from data output circuit 6, as shown by the solid line of FIG. 11 (c).

The following problem arises in the conventional memory device having the structure described above. In the test mode, when the read data $D_R$ changes from invalid to valid at the timing shogun in FIG. 11 (b) (the timing later than that in the normal operation mode of FIG. 10 (b)), a part of the invalid data is once provided as the data output $D_O$ as shown by the solid line of FIG. 11 (c) because the waveform of the output control signal $\phi_C$ is fixed. Time required for change of the once-provided invalid data to valid data causes significant delay in output of the original valid data. Therefore, in the conventional memory device described above, the problem arises that access time of valid data in the test mode becomes long, resulting in a long time required for a function test of the memory device.

Accordingly, if the timing when the output control signal $\phi_C$ rises is delayed as shown by the broken line of FIG. 11 (a), the output data $D_0$ in the high impedance state changes to valid data at the timing shown by the broken line of FIG. 11 (c), so that the output of invalid data as described above can be prevented, and consequently delay in the timing of reading in the test mode can be reduced.

The delay in rise of the output control signal $\phi_C$, however, causes delay in rise of the signal $\phi_C$ also in the normal operation mode, so that the problem arises that high speed operation of the memory device in the normal operation mode is difficult to be performed.

SUMMARY OF THE INVENTION

One object of the present invention is to provide a memory device having reduced time required for a function test of memory cells in the test mode without impairing high speed operation in the normal operation mode.

The memory device in accordance with the present invention includes a plurality of memory cells, data reading circuits, a data processing circuit and a control circuit. The data reading circuits read data from respective ones of memory cells selected from the plurality of memory cells. The data processing circuit applies a predetermined logical operation processing to the data read from said selected memory cells to convert the read data into data the number of which is less than that of the read data in the test mode. The control circuit delays the timing of output of the data from the data processing circuit in the test mode as compared with that in the normal operation mode.

In accordance with another aspect of the present invention, the memory device includes a memory cell array, data reading circuits, a mode designating signal supplying source, a data processing circuit and an output control circuit. The memory cell array includes a plurality of memory cells. The data reading circuits read data from respective ones of memory cells selected from the memory cell array. The mode designating signal supplying source supplies a mode designating signal for designating either a normal operation mode or a test mode. The data processing circuit, when the mode designating signal indicates the normal operation mode, selects at least one data from the data read from the selected memory cells to provide the selected data, and when the mode designating signal indicates the test mode, applies a predetermined logical operation processing to the data read from said selected memory cells with a certain delay time period to convert the read data into data the number of which is less than that of the read data to provide the converted data. The output control circuit, when the mode designating signal indicates the normal operation mode, provides an output data from the data processing circuit at a predetermined timing, and when the mode designating signal indicates the test mode, provides an output data from the data processing circuit at a timing delayed by said certain delay time period from said predetermined timing.

In the memory device according to the present invention, the timing of data output from the data processing circuit in the test mode is delayed from that in the normal operation, thereby preventing output of invalid data to the outside, and consequently advancing timing at which valid data is provided to the outside.

Additionally, in the memory device according to the present invention, the timing of data output from the data processing circuit in the test mode is delayed by a certain time required for the data processing circuit to perform logical operation, allowing reduction of access time in the test mode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a schematic diagram showing in detail the delay circuit shown in FIG. 1.

FIG. 3 is a waveform diagram showing the operation of the delay circuit shown in FIG. 2.

FIG. 4 is a waveform diagram showing the operation of the embodiment shown in FIG. 1.

DESCRIPTION OF THE PREFERRED EMBODIMENTS

Figure 1:
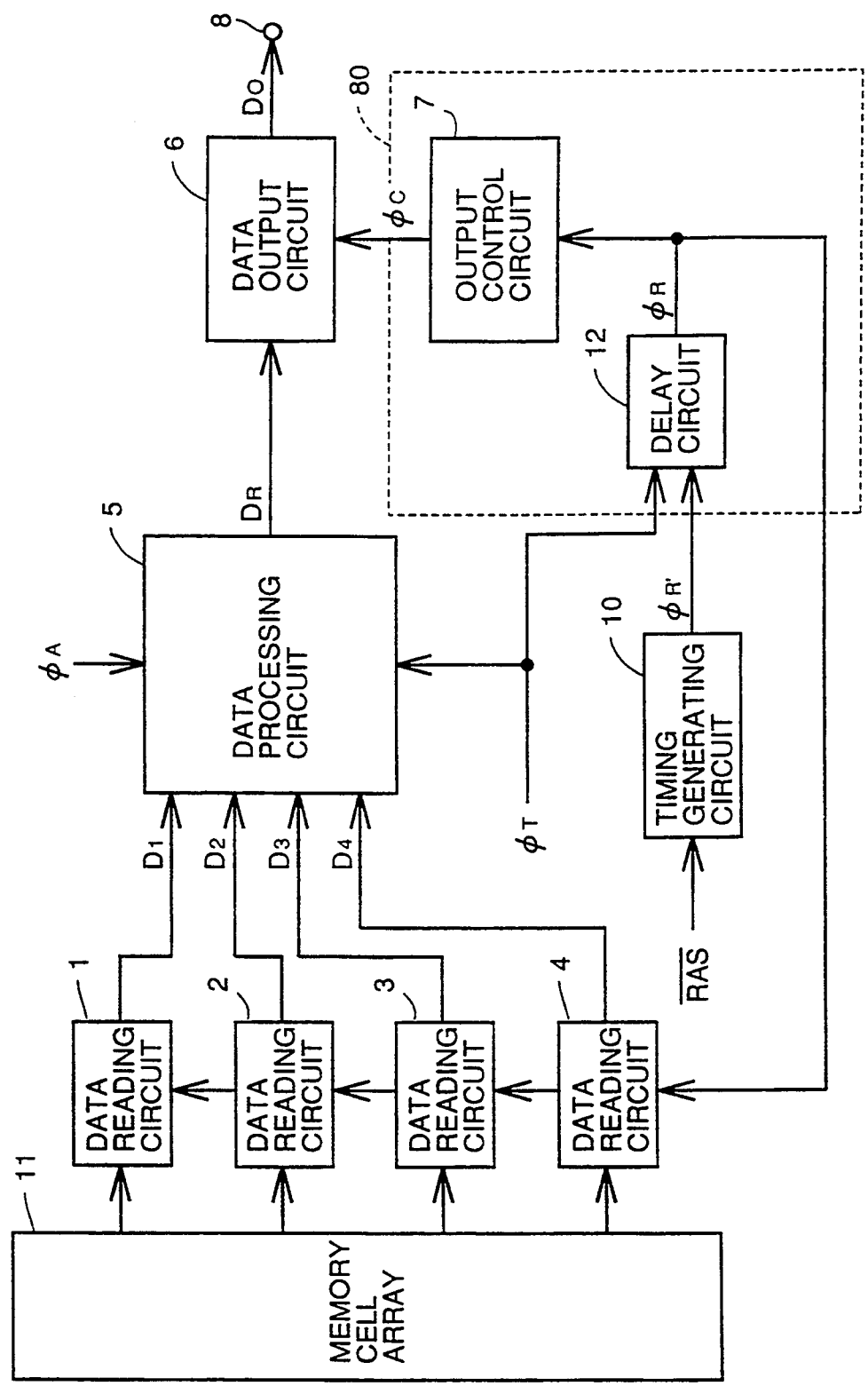
FIG. 1 is a block diagram showing a memory device according to one embodiment of the present invention.

An embodiment of the present invention will hereinafter be described with reference to the drawings. FIG. 1 is a block diagram showing a memory device according to one embodiment of the present invention. The embodiment shown in FIG. 1 is the same as the conventional memory device shown in FIG. 6 except the following points, and the description of the common portion is not repeated.

Figure 6:
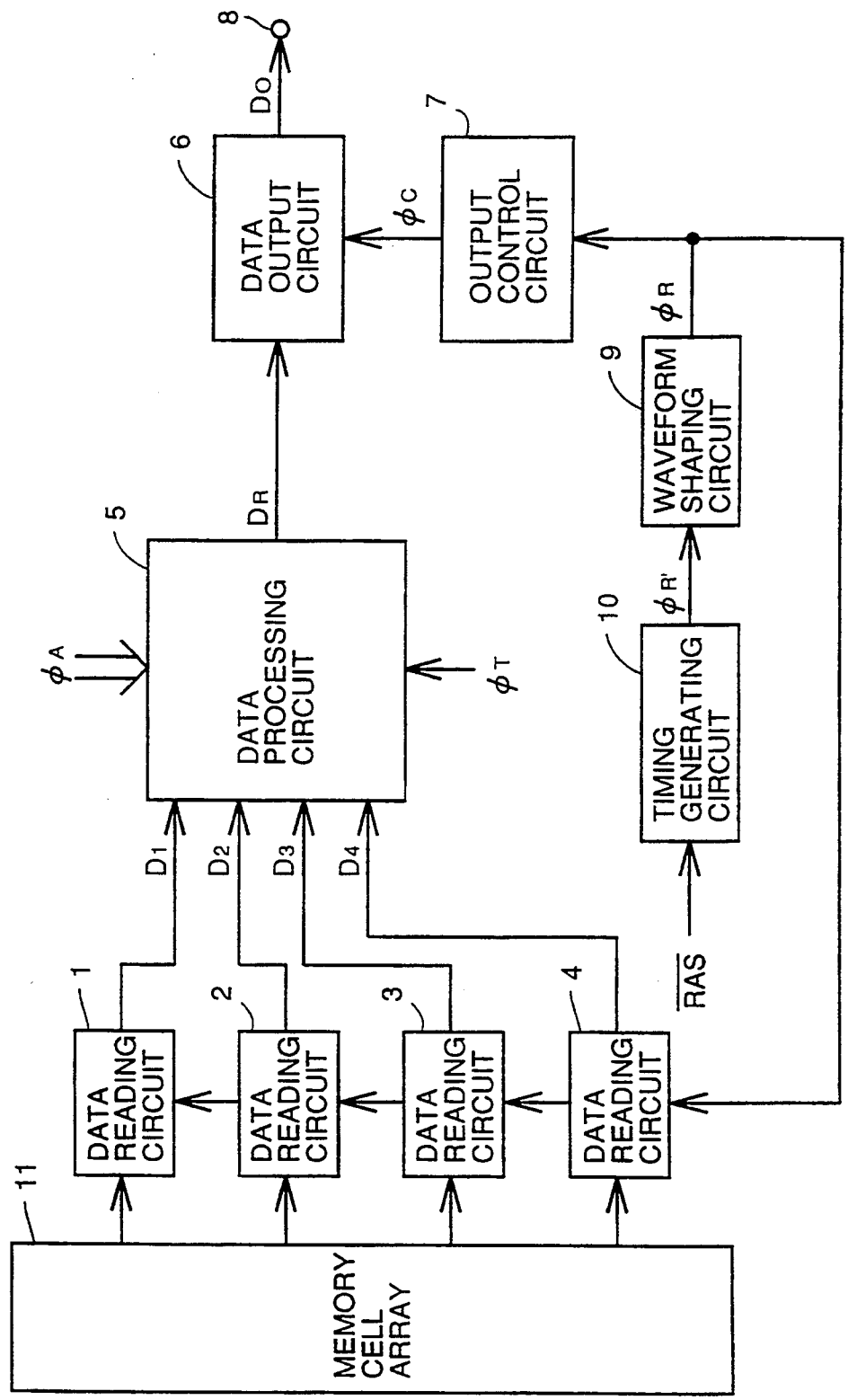
FIG. 6 is a block diagram showing one example of a conventional memory device.

In the embodiment of FIG. 1, a delay circuit 12 is provided in place of waveform shaping circuit 9 of FIG. 6 between timing generating circuit 10 and output control circuit 7. Delay circuit 12 and output control circuit 7 constitute a control circuit which delays the timing when data output circuit 6 provides data from data processing circuit 5 to an output terminal 8 in the test mode, from the timing of data output to output terminal 8 in the normal operation. Delay circuit 12 has a function to delay rise of a timing signal $\phi_R'$ in the test mode in response to a mode designating signal $\phi_T$ from a signal source, not shown, and specifically has the structure shown in FIG. 2, for example. FIG. 3 is a waveform diagram schematically showing the operation of delay circuit 12 shown in FIG. 2.

In the normal operation where the mode designating signal $\phi_T$ (FIG. 3 (a)) is at an L level, the signal $\phi_T$ is inverted to an H level by an inverter 121 to be continuously applied to one input of an NOR gate 122. To the other input of NOR gate 122 the signal $\phi_R'$ (FIG. 3 (b)) from timing generating circuit 10 is applied, and NOR gate 122 generates a signal which is always at an L level in the normal operation mode.

The signal at an L level is inverted through an inverter circuit 123 including three stages of inverters to be continuously applied as a signal at an H level to one input of an NAND gate 124. To the other input of NAND gate 124 the timing signal $\phi_R'$ is directly applied. As a result, an inverted signal of the signal $\phi_R'$ is obtained from NAND gate 124, which is further inverted by an inverter 125 and provided as a read control signal $\phi_R$ (FIG. 3 (c)). Specifically, as shown in the left half of the waveform diagram of FIG. 3, delay operation by delay circuit 12 is not performed in the normal operation mode where the mode designating signal $\phi_T$ is at an L level, resulting in the timing signal $\phi_R'$ being provided as it is, as the read control signal $\phi_R$.

In the test mode where the mode designated signal $\phi_T$ (FIG. 3 (a)) is at an H level, the signal $\phi_T$ is inverted to an L level by inverter 121 to be continuously applied to one input of NOR gate 122. As a result, NOR gate 122 serves as an inverter inverting the timing signal $\phi_R'$ applied to the other input thereof. Inverters 121 and 122 correspond to waveform shaping circuit 9 in the conventional example of FIG. 6.

More specifically, if the timing signal $\phi_R'$ is at an L level when the signal $\phi_T$ is at an H level (FIG. 3 (b)), both inputs of NOR gate 122 are at an L level, so that the output of NOR gate 122 is brought into an H level. The output at an H level is inverted to an L level by inverter circuit 123 to be applied to one input of NAND gate 124. Since the signal $\phi_R'$ at the other input of NAND gate 124 is also at an L level, the output of NAND gate 124 is brought into an H level, which is inverted by inverter 125 to be provided as the read control signal $\phi_R'$ at an L level (FIG. 3 (c)).

If the timing signal $\phi_R'$ to an H level when the signal $\phi_T$ is at an H level (FIG. 3 (b)), the output of NOR gate 122 changes from an H level to an L level simultaneously. The change in the output of NOR gate 122 is transmitted to one input of NAND gate 124 with a delay of certain time period by inverter circuit 123.

When the signal $\phi_R'$ changes to an H level, the other input of NAND gate 124 also changes to an H level, while transmission of the change to one input of NAND gate 124 is delayed as described above, whereby the output of NAND gate 124 remains at an H level during the certain time period (delay time period). When the certain delay time period described above has passed after the change of $\phi_R'$, the situation is achieved wherein two inputs of NAND gate 124 are both at an H level, changing the output of NAND gate 124 to an L level. This change is inverted to a change to an H level by inverter 125, and provided as the read control signal $\phi_R$.

That is, as shown in the right half of the waveform diagram in FIG. 3, in the test mode where the mode designating signal $\phi_T$ is at an H level, rise of the timing signal $\phi_R'$ to an H level is delayed by a certain time period by delay circuit 12 as shown by the solid line of FIG. 3 (c), and provided as the read control signal $\phi_R$.

When the signal $\phi_R'$, further changes to an L level, the other input of NAND gate 124 is immediately brought into an H level, so that the output of NAND gate 124 is brought into H level simultaneously. This change is inverted to change to an L level by inverter 125. Specifically, in the test mode, the read control signal $\phi_R$ falls simultaneously with fall of the timing signal $\phi_R'$ (FIG. 3 (b) and (c)).

Figure 10:
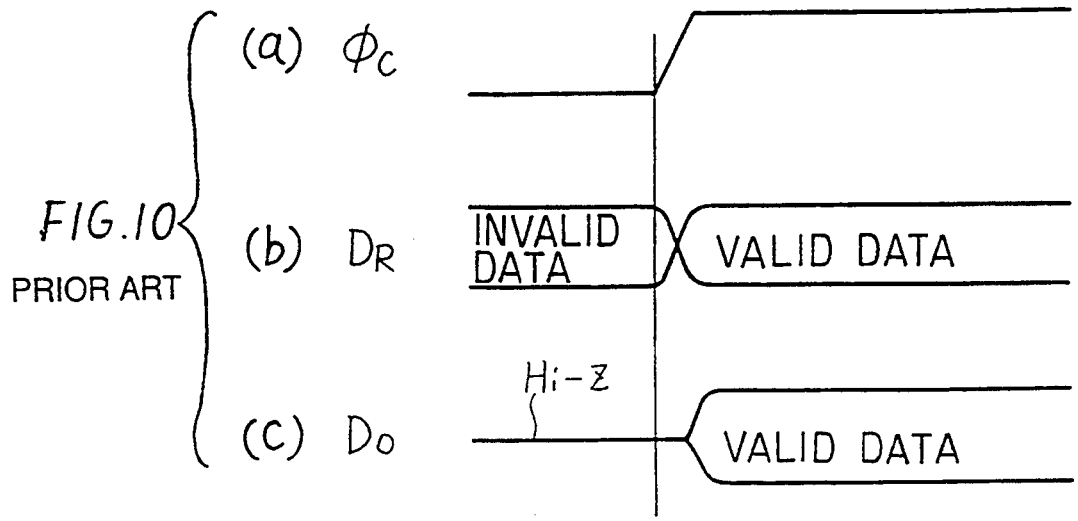
FIG. 10 is a waveform diagram showing the operation in the normal operation mode of the conventional example shown in FIG. 6.
Figure 11:
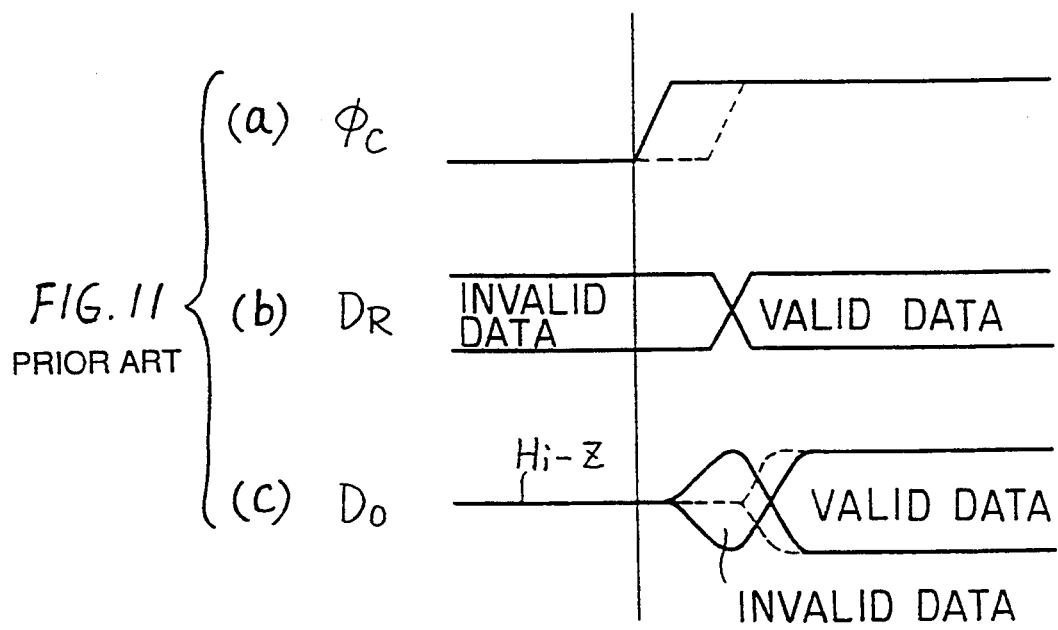
FIG. 11 is a waveform diagram showing the operation in the test mode of the conventional example shown in FIG. 6.

FIG. 4 is a waveform diagram showing the whole operation of the embodiment shown in FIG. 1. The operation in the normal operation mode of the embodiment in FIG. 1 is the same as that of the conventional example, because the timing signal $\phi_R$ applied to output control circuit 7 is a signal at the same timing as that of the timing signal $\phi_R$ in the conventional example described in conjunction with FIGS. 6 and 10. Therefore, the description thereof is not repeated, and only the operation in the test mode will be described.

Figure 7:
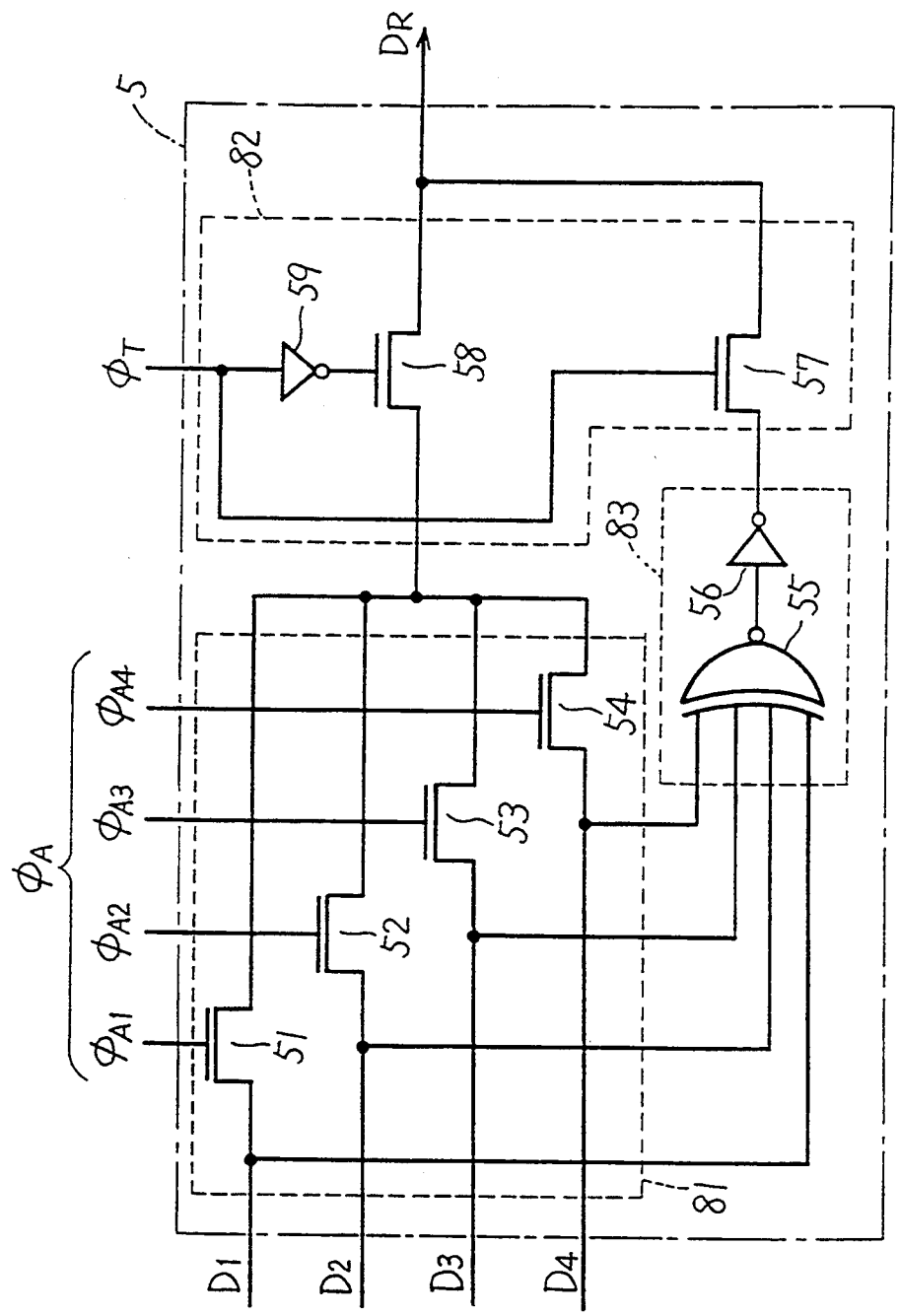
FIG. 7 is a schematic diagram showing in detail the data processing circuit shown in FIG. 6.

In the test mode, four data $D_1$ and $D_4$ are read from memory cell array 11 as in the normal operation, to be subjected to EX-OR operation by EX-OR circuit 55 (FIG. 7). Since the EX-OR operation requires a certain time period, the timing when read data $D_R$ (FIG. 4 (c)) changes from invalid to valid in the test mode will be delayed by the certain time period from the timing in the normal operation mode.

In accordance with this embodiment, therefore, the timing of activation of the read control signal $\phi_R$ is delayed by the certain time period in the test mode (the solid line in FIG. 4 (a)) from the normal timing (the broken line in FIG. 4 (a)), whereby the output control signal $\phi_C$ provided from output control circuit 7 is also delayed by the certain time period (the solid line in FIG. 4 (b)) from the normal operation (the broken line in FIG. 4 (b)). Accordingly, partial output of invalid data (the broken line in FIG. 4 (d)) is not provided from data output circuit 6, unlike in the conventional example, so that only valid data alone is provided as the output data $D_O$ (the solid line in FIG. 4 (d)).

Specifically, according to this embodiment, as can be seen from FIG. 4, the read control signal $\phi_R$ is delayed by a certain time period to prevent partial output of invalid data in comparison with the delay time period of output of valid data caused by partial output of invalid data in the case where the read control signal $\phi_R$ is not delayed. In other words, since a longer time period than the delay time period by the data processing circuit is required for changing invalid data into valid data after the invalid data has once been provided, delay of the timing of the output control signal by the above described delay time period results in the timing of output valid data being advanced. Consequently, access time in the test mode, that is, time required for a function test of the memory device can be reduced.

Although the case is described in the aforementioned embodiment, in which one selected data $D_R$ is provided out of the four data $D_1$ to $D_4$ in the normal operation mode and one EX-ORed data $D_R$ is provided in the test mode, the number of the data is not limited to the case in this embodiment. The present invention is applicable to a case where the number of output data is less than that of data read from the memory cell array; for example, a case where one output data is provided out of eight data read from the memory cell array, or where two output data are provided out of eight data read from the memory cell array.

Figure 5:
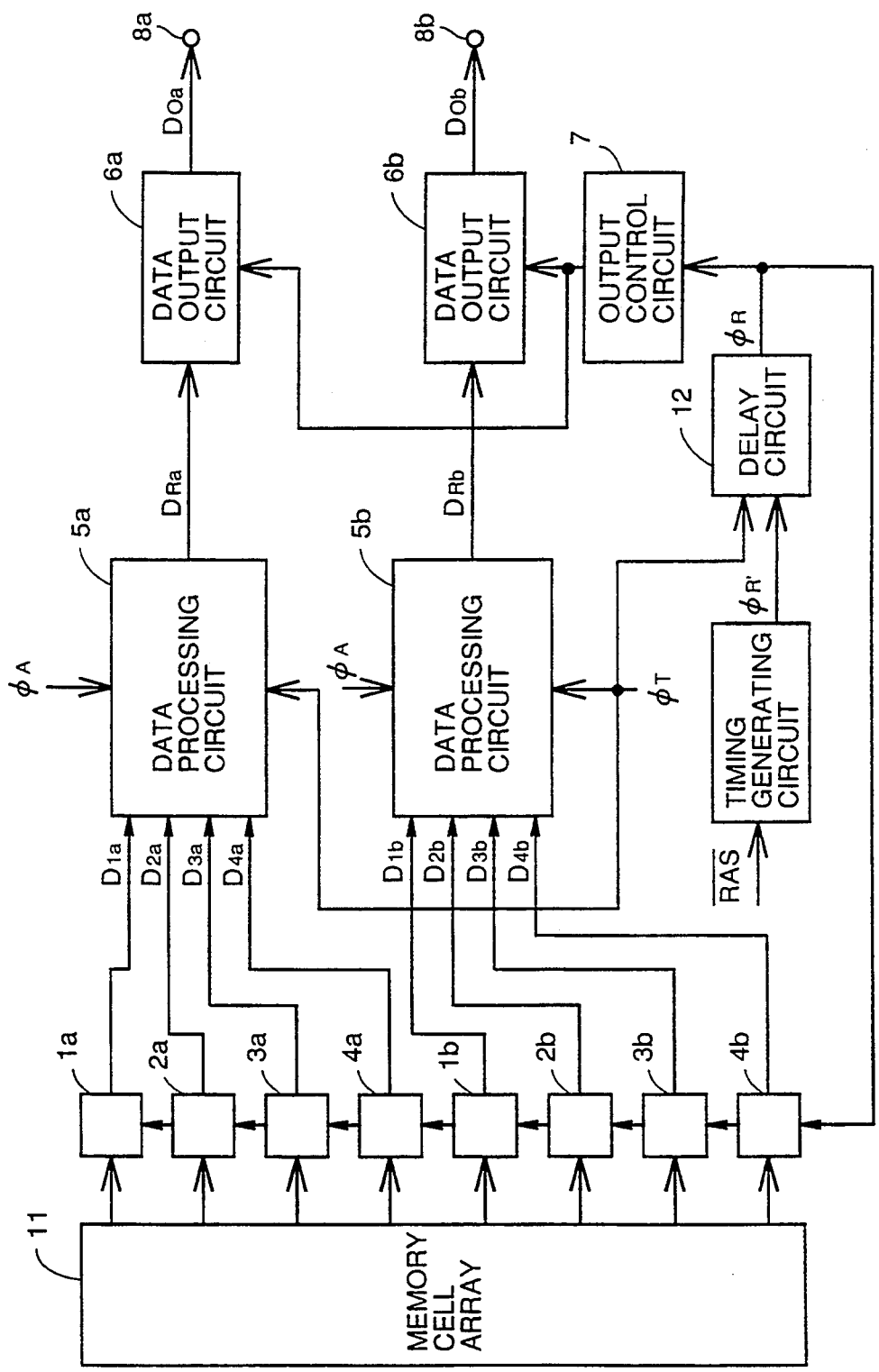
FIG. 5 is a block diagram showing a memory device according to another embodiment of the present invention.

FIG. 5 is a block diagram showing the embodiment in which two output data are provided out of eight data read from the memory cell array. In this embodiment, four data $D_{1a}$ to $D_{4a}$ read from memory cell array 11 by data reading circuits 1a to 4a are processed in one data processing circuit 5a, while four data $D_{1b}$ to $D_{4b}$ read from memory cell array 11 by data reading circuits 1b to 4b are processed in the other data processing circuit 5b. Data processing circuits 5a and 5b are assumed to have the same structure as data processing circuit 5 shown in FIG. 7. Data processing circuits 5a and 5b are operated by an address signal $\phi_A$ and a mode designating signal $\phi_T$ commonly applied thereto.

Figure 8:
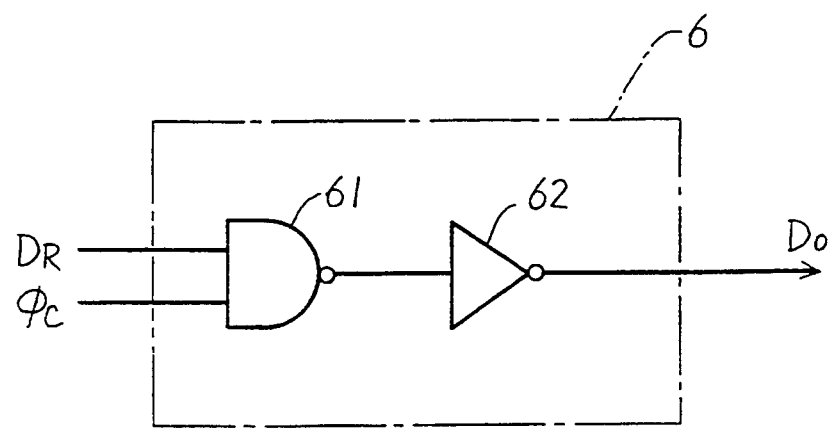
FIG. 8 is a schematic diagram showing in detail the data output circuit shown in FIG. 6.
Figure 9:
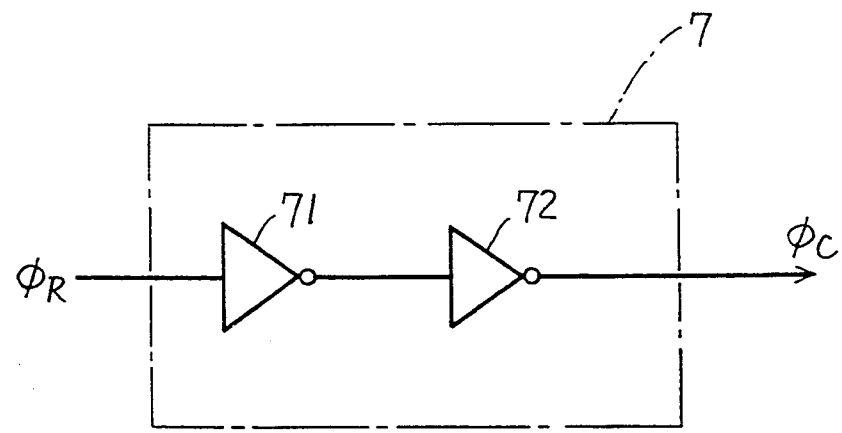
FIG. 9 is a schematic diagram showing in detail the output control circuit shown in FIG. 6.

Read data $D_{Ra}$ provided from data processing circuit 5a is applied to a data output circuit 6a and provided as output data $D_{Oa}$ through a terminal 8a, while read data $D_{Rb}$ provided from data processing circuit 5b is applied to a data output circuit 6b and provided as output data $D_{Ob}$ at a terminal 8b. Data output circuits 6a and 6b are assumed to have the same structure as data output circuit 6 shown in FIG. 8. The other structure and operation thereof is the same as in the embodiment of FIG. 1.

Even when two output data are obtained in parallel out of eight read data, common control over the timing of respective data output in the test mode by a single delay circuit 12 will thus prevent output of invalid data in respective outputs, whereby access time of valid data can be reduced.

As described above, according to the embodiment of the present invention, an output control circuit is provided which delays the timing of data output from data processing circuit in the test mode from that in the normal operation mode, thereby preventing output of invalid data to the outside in the test mode, and thus enabling timing of output of valid data to the outside to be advanced, and reduction of access time in the test mode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A memory device operable in a test mode and a normal operation mode comprising:
   a plurality of memory cells;
   data reading means for reading data from respective ones of memory cells selected from said plurality of memory cells;
   data processing means for applying a predetermined logical operation processing to said data read from said selected memory cells to convert said read data into data the number of which is less than that of said read data in the test mode; and
   control means for delaying the timing of output of said data from said data processing means in the test mode as compared with that in the normal operation mode.

2. The memory device according to claim 1, wherein said data processing means selects at least one data among said data read from said selected memory cells to provide the selected data in the normal operation mode.

3. The memory device according to claim 2, wherein said data processing means includes
   logical operation means for applying said predetermined logical operation processing to said data read from said selected memory cells,
   means for selecting at least one data from said data read from said selected memory cells, and
   switching means responsive to a mode designating signal applied externally, for selecting and providing an output of said selecting means when the normal operation mode is designated, and selecting and providing an output of said logical operation means when the test mode is designated.

4. The memory device according to claim 3, wherein said predetermined logical operation processing is exclusive OR processing.

5. The memory device according to claim 1, further comprising
   data output means responsive to an output of said control means output for defining timing of data output from said data processing means.

6. The memory device according to claim 5, wherein said control means includes
   output control means responsive to a timing signal externally applied for driving said data output means, and
   delay means for delaying said timing signal in the test mode as compared with that in the normal operation mode to apply the delayed timing signal to said data output means.

7. The memory device according to claim 6, wherein said delay means includes
   delay circuit means enabled only when the test mode is designated in response to a test mode signal externally applied, and
   AND means for applying AND operation to said externally applied timing signal and an output of said delay means.

8. A memory device having a test function, comprising:
   a memory cell array including a plurality of memory cells;
   data reading means for reading data from respective ones of memory cells selected from said memory cell array;
   means for applying a mode designating signal designating either a normal operation mode or a test mode;
   data processing means for selecting at least one data from said data read from said selected memory cells to provide the selected data when said mode designating signal indicates the normal operation mode, and for applying a predetermined logical operation processing to said data read from said selected memory cells with a certain delay time period to convert said read data into data the number of which is less than that of said read data to provide the converted data when said mode designating signal indicates the test mode; and control means for providing an output data from said data processing means at a predetermined timing when said mode designating signal indicates said normal operation mode, and providing an output data from said data processing means at a timing delayed by said certain delay time period from said predetermined timing when said mode designating signal indicates the test mode.

* * * * *